(12) United States Patent
Shimosawa et al.

(10) Patent No.: US 11,699,727 B2
(45) Date of Patent: Jul. 11, 2023

(54) SEMICONDUCTOR DEVICE

(71) Applicant: FUJI ELECTRIC CO., LTD., Kanagawa (JP)

(72) Inventors: Makoto Shimosawa, Matsumoto (JP); Takeyoshi Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 115 days.

(21) Appl. No.: 17/329,212

(22) Filed: May 25, 2021

(65) Prior Publication Data
US 2022/0013645 A1 Jan. 13, 2022

(30) Foreign Application Priority Data

Jul. 13, 2020 (JP) ................. 2020-119805

(51) Int. Cl.
| | | |
|---|---|---|
| *H01L 29/41* | (2006.01) | |
| *H01L 27/07* | (2006.01) | |
| *H01L 23/48* | (2006.01) | |
| *H01L 29/417* | (2006.01) | |
| *H01L 27/06* | (2006.01) | |
| *H01L 29/10* | (2006.01) | |
| *H01L 29/739* | (2006.01) | |
| *H01L 29/45* | (2006.01) | |
| *H01L 29/861* | (2006.01) | |
| *H01L 29/40* | (2006.01) | |

(52) U.S. Cl.
CPC .... *H01L 29/41708* (2013.01); *H01L 27/0664* (2013.01); *H01L 29/1095* (2013.01); *H01L 29/407* (2013.01); *H01L 29/45* (2013.01); *H01L 29/7397* (2013.01); *H01L 29/8613* (2013.01)

(58) Field of Classification Search
USPC ...................................................... 257/140
See application file for complete search history.

(56) References Cited

U.S. PATENT DOCUMENTS

| | | |
|---|---|---|
| 2001/0018252 A1 | 8/2001 | Park |
| 2002/0000610 A1 | 1/2002 | Jang |
| 2002/0110999 A1 | 8/2002 | Lu |
| 2003/0075759 A1 | 4/2003 | Kawano |
| 2004/0119117 A1 | 6/2004 | Kushida |

(Continued)

FOREIGN PATENT DOCUMENTS

| | | | | |
|---|---|---|---|---|
| CN | 103165524 | * | 6/2013 | ........... H01L 21/768 |
| JP | 2001223207 A | | 8/2001 | |

(Continued)

*Primary Examiner* — Fazli Erdem

(57) ABSTRACT

Provided is a semiconductor device including: a drift region of first conductivity type provided in a semiconductor substrate; a base region of second conductivity type provided in the semiconductor substrate; an emitter region of first conductivity type provided at a front surface of the semiconductor substrate; a contact region of second conductivity type provided on the base region and having a higher doping concentration than the base region; a contact trench portion provided at the front surface of the semiconductor substrate; a first barrier layer provided at a side wall and a bottom surface of the contact trench portion; and a second barrier layer provided in contact with the contact region at the side wall of the contact trench portion.

14 Claims, 12 Drawing Sheets

(56) References Cited

U.S. PATENT DOCUMENTS

| | | | |
|---|---|---|---|
| 2005/0287799 A1* | 12/2005 | Lee | H01L 21/28512 |
| | | | 257/E21.162 |
| 2006/0065923 A1* | 3/2006 | Pfirsch | H01L 29/41 |
| | | | 257/E29.112 |
| 2008/0268612 A1 | 10/2008 | Cho | |
| 2011/0095361 A1* | 4/2011 | Chang | H01L 29/47 |
| | | | 257/334 |
| 2013/0069146 A1 | 3/2013 | Okumura | |
| 2014/0061742 A1 | 3/2014 | Nishitani | |
| 2015/0372090 A1 | 12/2015 | Oosawa | |
| 2016/0351446 A1 | 12/2016 | Yamaguchi | |
| 2018/0151410 A1 | 5/2018 | Usami | |
| 2018/0366548 A1 | 12/2018 | Naito | |
| 2020/0020579 A1* | 1/2020 | Kato | H01L 27/0716 |

FOREIGN PATENT DOCUMENTS

| | | |
|---|---|---|
| JP | 2002033383 A | 1/2002 |
| JP | 2002289690 A | 10/2002 |
| JP | 2003092405 A | 3/2003 |
| JP | 2003101019 A | 4/2003 |
| JP | 2004207289 A | 7/2004 |
| JP | 2006140239 A | 6/2006 |
| JP | 2008277741 A | 11/2008 |
| JP | 2009043966 A | 2/2009 |
| JP | 2013065724 A | 4/2013 |
| JP | 2014049707 A | 3/2014 |
| JP | 2014158013 A | 8/2014 |
| JP | 2016225512 A | 12/2016 |
| JP | 2018088436 A | 6/2018 |
| WO | 2018052099 A1 | 3/2018 |

* cited by examiner

SEMICONDUCTOR DEVICE

The contents of the following Japanese patent application are incorporated herein by reference:
NO. 2020-119805 filed in JP on Jul. 13, 2020

BACKGROUND

1. Technical Field

The present invention relates to a semiconductor device.

2. Related Art

Conventionally, a semiconductor device which includes a contact trench portion has been known. (For example, refer to Patent Documents 1-4.)
Patent Document 1: Japanese Unexamined Patent Application Publication No. 2014-158013
Patent Document 2: Japanese Unexamined Patent Application Publication No. 2013-065724
Patent Document 3: PCT International Publication No. 2018/052099
Patent Document 4: Japanese Unexamined Patent Application Publication No. 2016-225512

DESCRIPTION OF EXEMPLARY EMBODIMENTS

Figure 1:
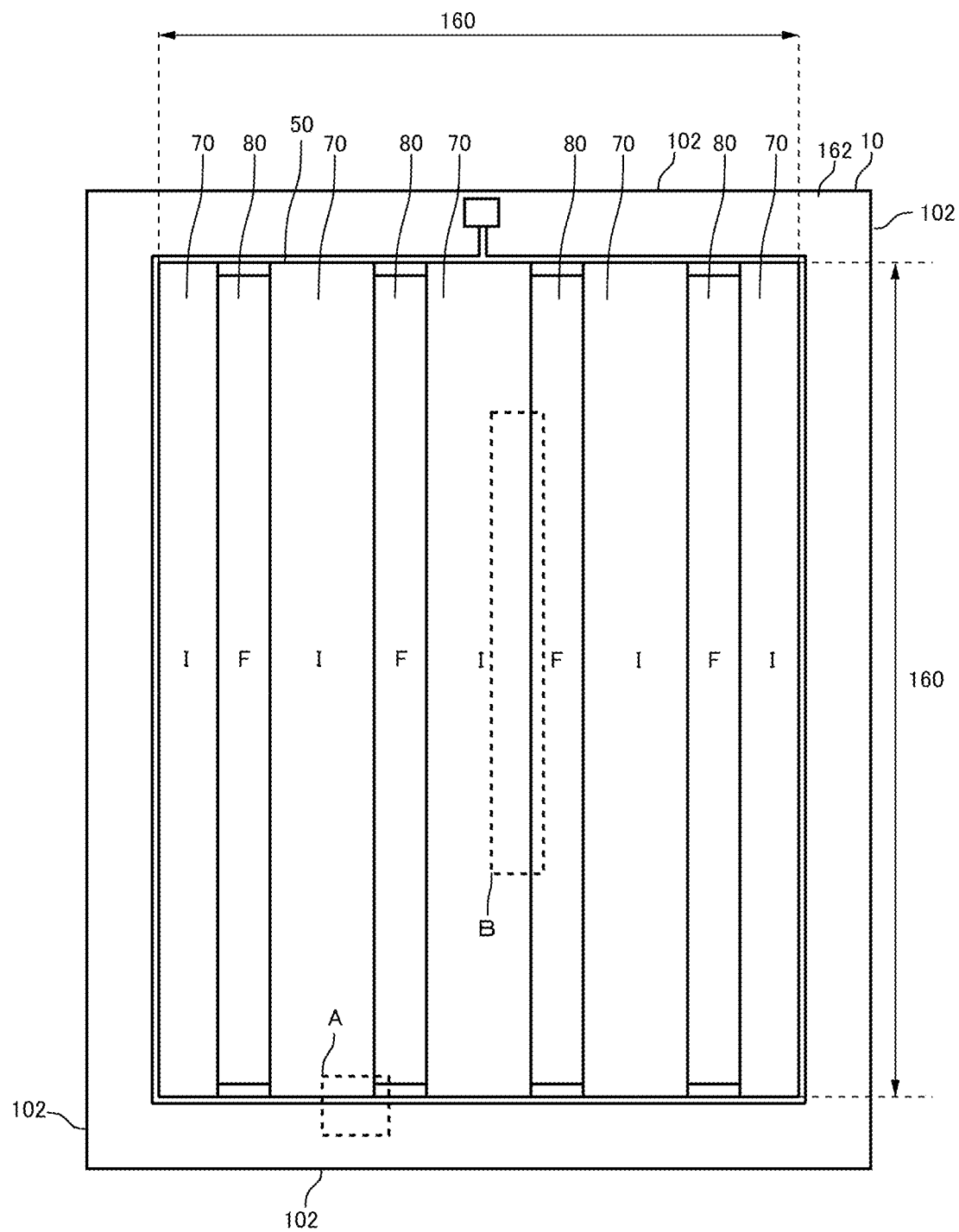
FIG. 1 illustrates an example of a top view of a semiconductor device 100 according to the example.

Hereinafter, the present invention will be described through embodiments of the invention, but the following embodiments do not limit the claimed invention. In addition, not all combinations of features described in the embodiments are necessarily required to solving means of the invention.

As used herein, one side in a direction parallel to a depth direction of a semiconductor substrate is referred to as "upper", and the other side is referred to as "lower". One surface of two main surfaces of a substrate, a layer or other members is referred to as an "upper surface", and the other surface is referred to as a "lower surface". The "upper", "lower", "front", and "back" directions are not limited to the gravitational direction or the direction of attachment to a substrate or the like in implementation of the semiconductor device.

As used herein, the technical matters may be described by use of the orthogonal coordinate axes of an X axis, a Y axis and a Z axis. As used herein, a plane parallel to a front surface of the semiconductor substrate is referred to as an XY plane and a depth direction of the semiconductor substrate is referred to as the Z axis. Note that, as used herein, the view of the semiconductor substrate in the Z axis direction is referred to as a planar view.

In each example, a first conductivity type represents N type and a second conductivity type represents P type. However, the first conductivity type may be P type and the second conductivity type may be N type. In this case, the conductivity types of the substrate, layers, regions or the like in each example have an opposite polarity, respectively.

As used herein, a layer or region of N or P type represents a layer or region where electrons or holes exist as a majority carrier, respectively. In addition, the symbols "+" and "−" added to N or P represent regions of a higher doping concentration and a lower doping concentration, respectively, than regions without these symbols, and the symbol "++" represents a higher doping concentration than "+" while the symbol "−−" represents a lower doping concentration than "−".

As used herein, the term "doping concentration" refers to the concentration of donor or acceptor dopants. Therefore, the unit is /cm$^3$. As used herein, a difference between the concentration of donors and the concentration of acceptors (that is, a net doping concentration) may be referred to as a doping concentration. In this case, the doping concentration can be measured by the SR method. In addition, a chemical concentration of donors and acceptors may also be referred to as a doping concentration. In this case, the doping concentration can be measured by the SIMS method. Unless otherwise specified, any of the doping concentrations set forth above may be used herein. Unless otherwise specified, a peak value of the distribution of doping concentrations in a doped region may be referred to as the doping concentration in the doped region.

In addition, as used herein, the term "dosage" refers to the number of ions implanted into a wafer per unit area during ion implantation. Therefore, the unit is /cm$^2$. Note that a dosage of a semiconductor region can refer to an integrated concentration which is an integrated value of the doping concentrations across the semiconductor region in the depth direction. The unit of the integrated concentration is /cm$^2$. Therefore, the dosage may be treated as the integrated concentration. The integrated concentration may also be an integral value to the half width. Alternatively, if spectra of other semiconductor regions overlap, the impact of other semiconductor regions may be excluded to derive the integrated concentration.

Therefore, as used herein, the level of the doping concentration can be read as the level of the dosage. That is, if a doping concentration of one region is higher than a doping concentration of another region, it can be understood that the dosage of said one region is higher than the dosage of said another region.

FIG. 1 illustrates an example of a top view of a semiconductor device 100 according to the example FIG. 1 illustrates a position of each member as being projected onto a front surface of a semiconductor substrate 10. FIG. 1 illustrates only some members of the semiconductor device 100 while omitting some members.

The semiconductor device 100 includes the semiconductor substrate 10. The semiconductor substrate 10 includes an end side 102 in a plan view. As used herein, unless otherwise specified, a plan view simply refers to a view from the side of the front surface of the semiconductor substrate 10. The semiconductor substrate 10 of the present example includes two pairs of end sides 102 opposing each other in a plan view. In FIG. 1, the X axis and the Y axis are parallel to any of end sides 102. In addition, the Z axis is perpendicular to the front surface of the semiconductor substrate 10.

The semiconductor substrate 10 is provided with an active region 160. The active region 160 refers to a region where main currents flow in the depth direction between the front surface and the back surface of the semiconductor substrate 10, when the semiconductor device 100 is operated. An emitter electrode is provided above the active region 160, but omitted in FIG. 1.

The active region 160 is provided with a transistor portion 70 including a transistor device such as an IGBT and a diode portion 80 including a diode device such as a free wheel diode (FWD). For example, the semiconductor device 100 is a reverse conducting IGBT (RC-IGBT). Note that the semiconductor device 100 may be an IGBT or an MOS transistor.

In the example of FIG. 1, transistor portions 70 and diode portions 80 are alternately arranged along a predetermined arrangement direction (the X axis direction in the present example) of the front surface of the semiconductor substrate 10. In another example, the active region 160 may be provided with only one of the transistor portions 70 and the diode portions 80.

In FIG. 1, the symbol "I" is indicated in the region of the transistor portion 70 and the symbol "F" is indicated in the region of the diode portion 80. As used herein, in a plan view, a direction perpendicular to the arrangement direction may be referred to as an extending direction (the Y axis direction in FIG. 1). The transistor portion 70 and the diode portion 80 may have a longitudinal side in the extending direction, respectively. That is, the transistor portion 70 has a length in the Y axis direction greater than a width in the X axis direction. Similarly, the diode portion 80 has a length in the Y axis direction greater than a width in the X axis direction. The extending direction of the transistor portion 70 and the diode portion 80 may be the same as a longitudinal direction of each trench portion which will be described below.

In FIG. 1, an edge of the transistor portion 70 in the Y axis direction is positioned closer to the end side 102 than an edge of the diode portion 80 in the Y axis direction. In addition, the width of the transistor portion 70 in the X axis direction is greater than the width of the diode portion 80 in the X axis direction.

The diode portion 80 includes a cathode region of N+ type in a region in contact with the back surface of the semiconductor substrate 10. As used herein, the region provided with the cathode region is referred to as the diode portion 80. That is, the diode portion 80 is a region which overlaps with the cathode region in a plan view. The back surface of the semiconductor substrate 10 may be provided with a collector region of P+ type in a region other than the cathode region.

The transistor portion 70 includes a collector region of P+ type in a region in contact with the back surface of the semiconductor substrate 10. In addition, the transistor portion 70 includes emitter regions of N type, base regions of P type, and gate trench portions including gate conductive portions and gate insulating films which are periodically arranged at the side of the front surface of the semiconductor substrate 10.

The semiconductor device 100 may include one or more pads above the semiconductor substrate 10. As an example, the semiconductor device 100 may also include pads such as a gate pad, an anode pad, a cathode pad and a current sense pad. Each pad is arranged in the vicinity of the end side 102. The vicinity of the end side 102 refers to a region between the end side 102 and the emitter electrode in a plan view. In implementation of the semiconductor device 100, each pad may be connected to an external circuit via a wiring such as a wire.

The gate metal layer 50 is arranged between the active region 160 and the end side 102 of the semiconductor substrate 10 in a plan view. The gate metal layer 50 connects the gate trench portion and the gate pad. The gate metal layer 50 of the present example surrounds the active region 160 in a plan view. A region surrounded by the gate metal layer 50 in a plan view may be referred to as the active region 160.

The semiconductor device 100 of the present example includes an edge termination structure 162 between the active region 160 and the end side 102. The edge termination structure 162 of the present example is arranged between the gate metal layer 50 and the end side 102. The edge termination structure 162 reduces concentration of electric fields at the side of the front surface of the semiconductor substrate 10. The edge termination structure 162 may include a plurality of guard rings. The guard ring is a region of P type in contact with the front surface of the semiconductor substrate 10. The plurality of guard rings can extend a depletion layer at an upper side of the active region 160 outwardly so as to improve the breakdown voltage of the semiconductor device 100. The edge termination structure 162 may further include at least one of a field plate and an RESURF provided in a circular form surrounding the active region 160.

Figure 2:
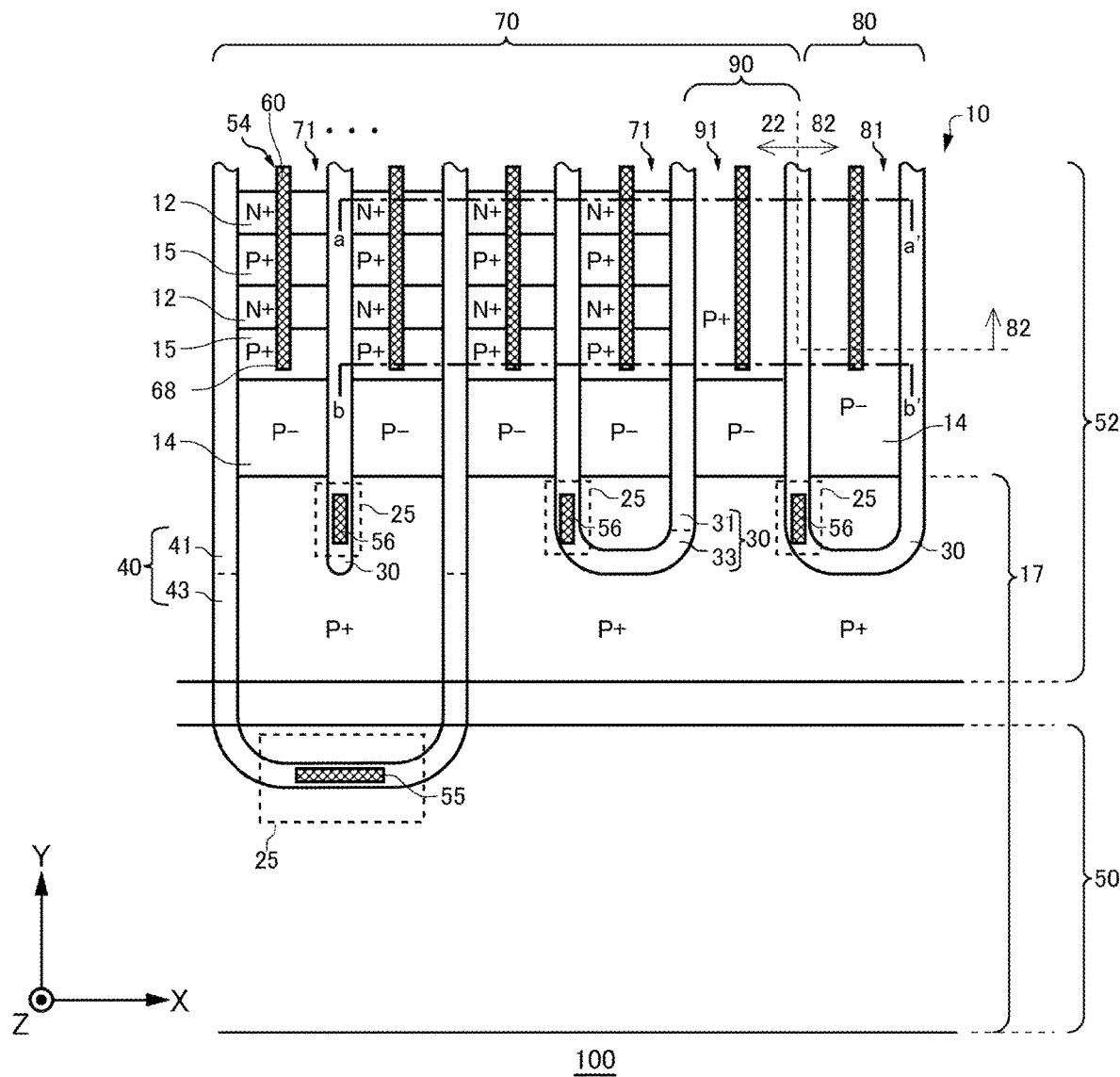
FIG. 2 is an enlarged view which illustrates an example of a region A in FIG. 1.

FIG. 2 is an enlarged view which illustrates an example of a region A in FIG. 1. The region A illustrates the vicinity of the boundary between the transistor portion 70 and the diode portion 80 of the semiconductor device 100 in a plan view, at the edge side in the negative direction of the Y axis.

The transistor portion 70 is a region where the collector region 22 provided at the back surface side of the semiconductor substrate 10 is projected onto the front surface of the semiconductor substrate 10. The collector region 22 of the present example is of P+ type, as an example. The transistor portion 70 includes a transistor such as an IGBT. The transistor portion 70 includes a boundary portion 90 positioned at the boundary between the transistor portion 70 and the diode portion 80. The boundary portion 90 is provided in a mesa portion of the transistor portion 70 which is adjacent to the diode portion 80 and does not operate as a transistor.

The diode portion 80 is a region where the cathode region 82 provided at the back surface side of the semiconductor substrate 10 is projected onto the front surface of the semiconductor substrate 10. The cathode region 82 of the present example is of N+ type, as an example. The diode portion 80 includes a diode such as a free wheel diode (FWD) provided adjacent to the transistor portion 70 at the front surface of the semiconductor substrate 10.

The semiconductor substrate 10 may be a silicon substrate, may be a silicon carbide substrate, or may be a nitride semiconductor substrate such as gallium nitride, or the like. The semiconductor substrate 10 of the present example is a silicon substrate.

The semiconductor device 100 of the present example includes, at the front surface 21 of the semiconductor substrate 10, a gate trench portion 40, a dummy trench portion 30, an emitter region 12, a base region 14, a contact region 15 and a well region 17. In addition, the semiconductor device 100 of the present example includes an emitter electrode 52 and a gate metal layer 50 provided above the front surface 21 of the semiconductor substrate 10.

The emitter electrode 52 is provided above the gate trench portion 40, the dummy trench portion 30, the emitter region 12, the base region 14, the contact region 15 and the well region 17. In addition, the gate metal layer 50 is provided above the gate trench portion 40 and the well region 17.

The emitter electrode 52 and the gate metal layer 50 are formed of a metal containing material. At least some regions of the emitter electrode 52 may be formed of aluminum, aluminum-silicon alloy, or aluminum-silicon-copper alloy. At least some regions of the gate metal layer 50 may be formed of aluminum, aluminum-silicon alloy, or aluminum-silicon-copper alloy. The emitter electrode 52 and the gate metal layer 50 may include a barrier metal formed of titanium, titanium compound or the like, which underlies a region formed of aluminum or the like. The emitter electrode 52 and the gate metal layer 50 are provided to be separated from each other.

The emitter electrode 52 and the gate metal layer 50 are provided above the semiconductor substrate 10 with an interlayer dielectric film 38 interposed therebetween. The interlayer dielectric film 38 is omitted from FIG. 2. The interlayer dielectric film 38 is provided with a contact hole 54, a contact hole 55 and a contact hole 56 which extend therethrough.

The contact hole 55 connects gate conductive portions within the gate trench portions 40 in the transistor portion 70 to the gate metal layer 50. The contact hole 55 may be provided with a plug formed therein, where the plug is formed of tungsten or the like.

The contact hole 56 connects dummy conductive portions within the dummy trench portions 30 provided in the transistor portion 70 and the diode portion 80 to the emitter electrode 52. The contact hole 56 may be provided with a plug formed therein, where the plug is formed of tungsten or the like.

The connecting part 25 electrically connects a front surface side electrode such as the emitter electrode 52 or the gate metal layer 50 to the semiconductor substrate 10. In an example, the connecting part 25 is provided in a region including the interior of the contact hole 55, between the gate metal layer 50 and the gate conductive portion. The connecting part 25 is also provided in a region including the interior of the contact hole 56, between the emitter electrode 52 and the dummy conductive portion. The connecting part 25 is formed of a conductive material including a metal such as tungsten or the like and polysilicon doped with impurities. In addition, the connecting part 25 may also include a barrier metal of titanium nitride or the like. Herein, the connecting part 25 is formed of polysilicon (N+) doped with N type impurities. The connecting part 25 is provided above the front surface 21 of the semiconductor substrate 10 via an insulating film such as an oxide film, or the like.

The gate trench portion 40 is arranged at a predetermined interval along a predetermined arrangement direction (the X axis direction in the present example). The gate trench portion 40 of the present example may include: two extending portions 41 which extends along an extending direction (the Y axis direction in the present example) parallel to the front surface 21 of the semiconductor substrate 10 and perpendicular to the arrangement direction; and a connecting portion 43 which connects two extending portions 41.

Preferably, at least a part of the connecting portion 43 is formed in a curved shape. Connecting the end portions of two extending portions 41 of the gate trench portion 40 can reduce concentration of electric fields at the end portions of the extending portions 41. At the connecting portion 43 of the gate trench portion 40, the gate metal layer 50 may be connected to the gate conductive portion.

The dummy trench portion 30 is a trench portion which includes a dummy conductive portion provided therein and electrically connected to the emitter electrode 52. The dummy trench portion 30 is arranged, similarly to the gate trench portion 40, at a predetermined interval along a predetermined arrangement direction (the X axis direction in the present example). The dummy trench portion 30 of the present example may have, similarly to the gate trench portion 40, a U shape on the front surface 21 of the semiconductor substrate 10. That is, the dummy trench portion 30 may include two extending portions 31 which extend along the extending direction and a connecting portion 33 which connects two extending portions 31.

The transistor portion 70 of the present example has a configuration of repeatedly arranged two gate trench portions 40 and three dummy trench portions 30. That is, the transistor portion 70 of the present example includes the gate trench portions 40 and the dummy trench portions 30 at a ratio of 2:3. For example, the transistor portion 70 includes one extending portion 31 between two extending portions 41. In addition, the transistor portion 70 includes two extending portions 31 adjacent to the gate trench portion 40.

However, the ratio of the gate trench portions 40 and the dummy trench portions 30 is not limited to the present example. The ratio of the gate trench portions 40 and the dummy trench portions 30 may be 1:1 or may be 2:4. Alternatively, the transistor portion 70 may have a namely full gate configuration provided with the gate trench portions 40 only but no dummy trench portions 30.

The well region 17 is provided closer to the front surface 21 of the semiconductor substrate 10 than the drift region 18 which will be described below. The well region 17 is an example of a well region provided at the edge side of the semiconductor device 100. The well region 17 is of P+ type, as an example. The well region 17 is formed within a predetermined range from the edge of the active region provided with the gate metal layer 50. The well region 17 may have a diffusion depth greater than the depth of the gate trench portion 40 and the dummy trench portion 30. Some regions of the gate trench portion 40 and the dummy trench portion 30 at the side of the gate metal layer 50 is formed in the well region 17. The bottoms of the gate trench portion 40 and the dummy trench portion 30 at the end portions in the extending direction may be covered with the well region 17.

The contact hole 54 is formed above each region of the emitter region 12 and the contact region 15 in the transistor portion 70. The contact hole 54 is provided above the contact region 15 in the boundary portion 90. The contact hole 54 is provided above the base region 14 in the diode portion 80. No contact holes 54 are provided above the well region 17 provided at the both ends in the Y axis direction. In this manner, the interlayer dielectric film includes one or more contact holes 54 formed therein. One or more contact holes 54 may be provided to extend in the extending direction.

The contact trench portion 60 electrically connects the emitter electrode 52 to the semiconductor substrate 10. The contact trench portion 60 is provided in the contact hole 54. The contact trench portion 60 is provided to extend in the extending direction. That is, the contact trench portion 60 is arranged in a stripe pattern along the gate trench portion 40 and the dummy trench portion 30.

The terminal end 68 is the end portion of the contact trench portion 60 in the extending direction. The terminal end 68 may be provided in a region where the contact region 15 is formed at the front surface 21 in the mesa portion 71 and the mesa portion 91. The terminal end 68 may be provided in a region where the base region 14 is formed at the front surface 21 in the mesa portion 81. The mesa portion 71, the mesa portion 81 and the mesa portion 91 will be described below.

The boundary portion 90 is a region provided in the transistor portion 70 and in contact with the diode portion 80. The boundary portion 90 includes the contact region 15. Alternatively, the boundary portion 90 may not include the contact region 15. The boundary portion 90 of the present example does not include the emitter region 12. In an example, the trench portions in the boundary portion 90 are the dummy trench portions 30. The boundary portion 90 of the present example includes the trench portions of which the dummy trench portions 30 are arranged at the both ends in the X axis direction.

The mesa portion 71, the mesa portion 81 and the mesa portion 91 are mesa portions provided in contact with the trench portions, in a plane parallel to the front surface 21 of the semiconductor substrate 10. The mesa portion is a portion of the semiconductor substrate 10 interposed between two trench portions adjacent to each other, and may be a portion ranging from the front surface 21 of the semiconductor substrate 10 to the depth of the lowermost bottom portion of each trench portion. The extending portion of each trench portion may represent one trench portion. That is, a region interposed between two extending portions may represent the mesa portion.

The mesa portion 71 is provided in contact with at least one of the dummy trench portion 30 or the gate trench portion 40 in the transistor portion 70. The mesa portion 71 includes the well region 17, the emitter region 12, the base region 14, and the contact region 15 at the front surface 21 of the semiconductor substrate 10. The mesa portion 71 includes the emitter regions 12 and the contact regions 15 alternately provided in the extending direction.

The mesa portion 91 is provided in the boundary portion 90. The mesa portion 91 includes the contact region 15 at the front surface 21 of the semiconductor substrate 10. The mesa portion 91 of the present example includes the base region 14 and the well region 17 in the negative direction of the Y axis.

The mesa portion 81 is provided in a region interposed between the dummy trench portions 30 adjacent to each other in the diode portion 80. The mesa portion 81 of the present example includes the base region 14 and includes the well region 17 in the negative direction of the Y axis, at the front surface 21 of the semiconductor substrate 10. The mesa portion 81 may also be provided with the contact region 15 closer to the front surface 21 than the base region 14, in the similar manner as in the boundary portion 90.

The base region 14 is a region provided at the side of the front surface 21 of the semiconductor substrate 10 in the transistor portion 70 and the diode portion 80. The base region 14 is of P− type, as an example. The base region 14 may be provided at the both edges of the mesa portion 71 and the mesa portion 91 in the Y axis direction, at the front surface 21 of the semiconductor substrate 10. Note that FIG. 2 only illustrates the edge of the base region 14 in the negative direction of the Y axis.

The emitter region 12 is of the same conductivity type as that of the drift region 18 and has a higher doping concentration than the drift region 18. The emitter region 12 of the present example is of N+ type, as an example. An example of a dopant of the emitter region 12 is arsenic (As). The emitter region 12 is provided in contact with the gate trench portion 40 at the front surface 21 in the mesa portion 71. The emitter region 12 may be provided to extend from one trench portion to the other trench portion of two trench portions which interpose the mesa portion 71 therebetween in the X axis direction. The emitter region 12 is also provided below the contact hole 54.

In addition, the emitter region 12 may be in contact with the dummy trench portion 30 or may not. The emitter region 12 of the present example is in contact with the dummy trench portion 30. The emitter region 12 may not be provided in the mesa portion 81 or the mesa portion 91.

The contact region 15 is of the same conductivity type as that of the base region 14 and has a higher doping concentration than the base region 14. The contact region 15 of the present example is of P+ type, as an example. The contact region 15 of the present example is provided at the front surfaces 21 of the mesa portion 71 and the mesa portion 91. The contact region 15 may be provided from one trench portion to the other trench portion of two trench portions which interpose the mesa portion 71 or the mesa portion 91 therebetween in the X axis direction. The contact region 15 may be in contact with the gate trench portion 40 or may not. In addition, the contact region 15 may be in contact with the dummy trench portion 30 or may not. In the present example, the contact region 15 is in contact with the dummy trench portion 30 and the gate trench portion 40. The contact region 15 is also provided below the contact hole 54.

Figure 3A:
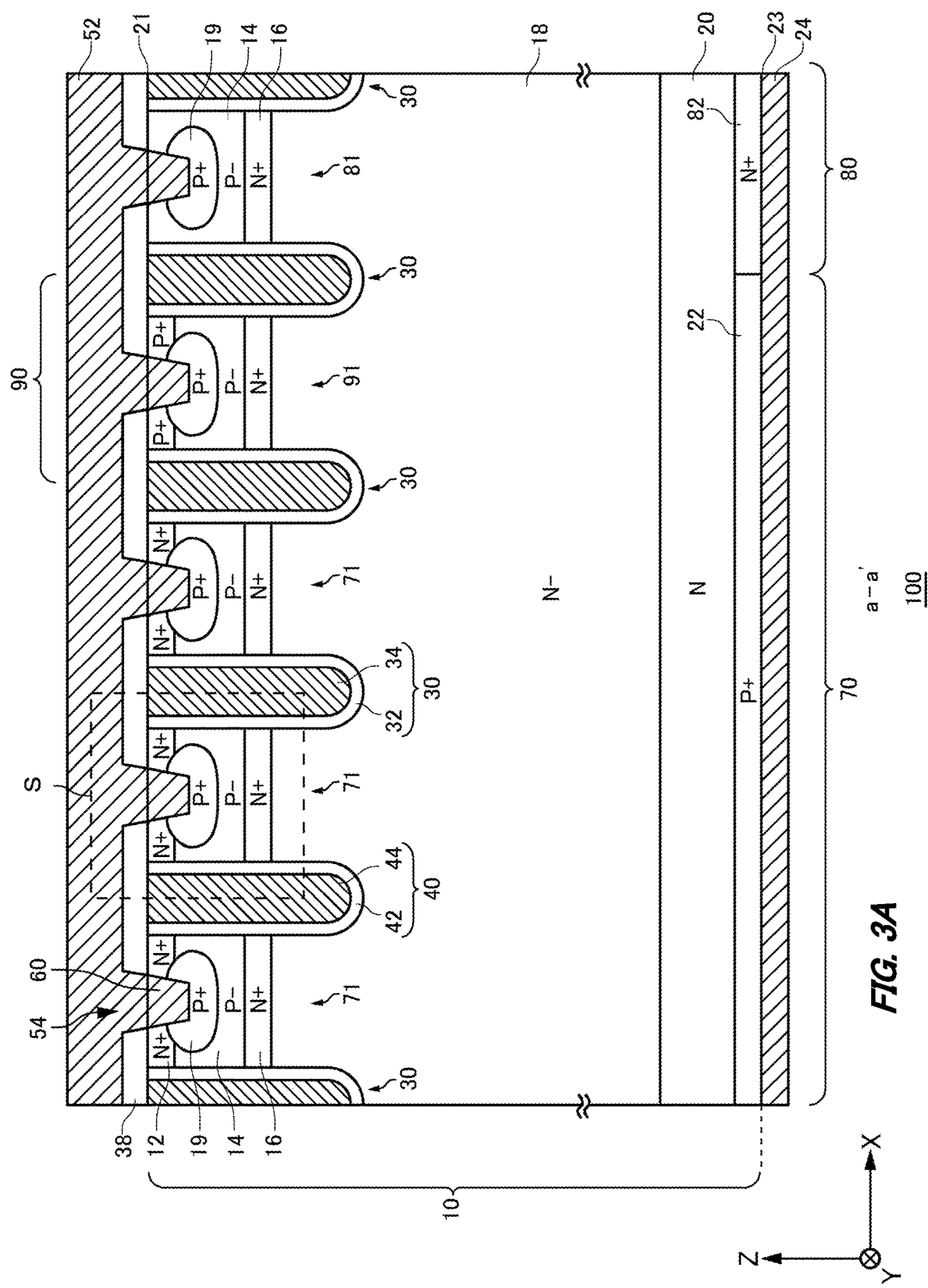
FIG. 3A is a diagram which illustrates an example of a cross section a-a' in FIG. 2.

FIG. 3A is a diagram which illustrates an example of a cross section a-a' in FIG. 2. The cross section a-a' is an XZ plane which extends through the emitter region 12 in the transistor portion 70. The semiconductor device 100 of the present example includes the semiconductor substrate 10, the interlayer dielectric film 38, the emitter electrode 52 and the collector electrode 24 in the cross section a-a'. The emitter electrode 52 is formed above the semiconductor substrate 10 and the interlayer dielectric film 38.

The drift region 18 is a region provided in the semiconductor substrate 10. The drift region 18 of the present example is of N− type, as an example. The drift region 18 may be a remaining region which remains undoped in the semiconductor substrate 10 after the other doped regions are formed. That is, the doping concentration of the drift region 18 may be the doping concentration of the semiconductor substrate 10.

The buffer region 20 is a region provided below the drift region 18. The buffer region 20 of the present example may be the same conductivity type as that of the drift region 18 and is of N type, as an example. The doping concentration of the buffer region 20 is higher than the doping concentration of the drift region 18. The buffer region 20 may serve as a field stop layer which prevents a depletion layer expanding from the lower surface side of the base region 14 from reaching the collector region 22 and the cathode region 82.

The collector region 22 is a region provided below the buffer region 20 in the transistor portion 70 and of the conductivity type different from that of the drift region 18. The cathode region 82 is a region provided below the buffer region 20 in the diode portion 80 and of the same conductivity type as that of the drift region 18. The boundary between the collector region 22 and the cathode region 82 is a boundary between the transistor portion 70 and the diode portion 80.

The collector electrode 24 is formed on the back surface 23 of the semiconductor substrate 10. The collector electrode 24 is formed of a conductive material such as a metal.

The base region 14 is a region provided above the drift region 18 in the mesa portion 71, the mesa portion 81 and the mesa portion 91, and of the conductivity type different from that of the drift region 18. The base region 14 of the present example is of P− type, as an example. The base region 14 is provided in contact with the gate trench portion 40. The base region 14 may be provided in contact with the dummy trench portion 30.

The emitter region 12 is provided between the base region 14 and the front surface 21. The emitter region 12 of the present example is provided in the mesa portion 71, but not provided in the mesa portion 81 or the mesa portion 91. The emitter region 12 is provided in contact with the gate trench portion 40. The emitter region 12 may be in contact with the dummy trench portion 30 or may not.

The contact region 15 is provided on the base region 14 in the mesa portion 91. The contact region 15 is provided in contact with the dummy trench portion 30 in the mesa portion 91. In another cross section, the contact region 15 may be provided at the front surface 21 in the mesa portion 71.

The contact trench portion 60 includes a conductive material filled within the contact hole 54. The contact trench portion 60 is provided between two trench portions adjacent to each other, from among a plurality of trench portions. The contact trench portion 60 is provided in contact with the contact layer 19 at the side of the front surface 21. The contact trench portion 60 of the present example is provided to extend through the emitter region 12 from the front surface 21, and be in contact with the contact layer 19 at the bottom surface. The contact trench portion 60 may include the same material as the emitter electrode 52.

The lower end of the contact trench portion 60 is lower than the lower end of the .emitter region 12. Providing the contact trench portion 60 can reduce the resistance of the base region 14 and facilitate minority carriers (for example, holes) to be extracted. This can improve the breakdown withstand capability such as a latch up withstand capability due to minority carriers.

The contact trench portion 60 includes a bottom surface of a substantially planar shape. The bottom surface of the contact trench portion 60 is covered with the contact layer 19. The contact trench portion 60 of the present example has a tapered shape with angled side walls. However, the side walls of the contact trench portion 60 may be provided to be substantially perpendicular to the front surface 21.

The contact layer 19 is provided below the contact trench portion 60. The contact layer 19 is a region of the same conductivity type as that of the base region 14 and has a doping concentration higher than the base region 14. The contact layer 19 of the present example is of P+ type, as an example. For example, the contact layer 19 is formed by ion implantation of boron (B+) or boron fluoride ($BF_2+$). The contact layer 19 may have the same doping concentration as the contact region 15. The contact layer 19 extracts minority carriers so as to suppress latch up.

The contact layer 19 is provided on the side walls and the bottom surface of the contact trench portion 60. The contact layer 19 of the present example is provided in each of the mesa portion 71, the mesa portion 81 and the mesa portion 91. The contact layer 19 may be provided to extend in the Y axis direction.

The emitter region 12 and the contact layer 19 are in contact with each other at the side wall of the contact trench portion 60. The side wall of the contact trench portion 60 of the present example is covered with the emitter region 12 and the contact layer 19. That is, the contact trench portion 60 is not in contact with the base region 14 in the transistor portion 70.

In the present example, the emitter region 12 and the contact layer 19 are in contact with each other so as to suppress injection of carriers from the emitter region 12, thereby improving the breakdown withstand capability. In addition, even if a large amount of currents occur in the semiconductor device 100, the contact layer 19 can improve the efficiency of extraction of minority carriers so that the potential of the base region 14 is maintained stable.

The accumulation region 16 is a region provided closer to the front surface 21 of the semiconductor substrate 10 than the drift region 18. The accumulation region 16 of the present example is of the same conductivity type as that of the drift region 18, and is of N+ type, as an example. The accumulation region 16 is provided in the transistor portion 70 and the diode portion 80. However, the accumulation region 16 may not be provided.

In addition, the accumulation region 16 is provided in contact with the gate trench portion 40. The accumulation region 16 may be in contact with the dummy trench portion 30 or may not. The doping concentration of the accumulation region 16 is higher than the doping concentration of the drift region 18. The dosage of ion implantation to the accumulation region 16 may be $1E12$ $cm^{-2}$ or more and $1E13$ $cm^{-2}$ or less. In addition, the dosage of ion implantation to the accumulation region 16 may also be $3E12$ $cm^{-2}$ or more and $6E12$ $cm^{-2}$ or less. Providing the accumulation region 16 can enhance the injection enhancement effect (IE effect) of carriers to reduce the ON voltage of the transistor portion 70. Note that the character E represents a power of 10, and $1E12$ $cm^{-2}$ represents $1 \times 10^{12}$ $cm^{-2}$, for example.

One or more gate trench portions 40 and one or more dummy trench portions 30 are provided at the front surface 21. Each trench portion is provided from the front surface 21 to the drift region 18. In a region where at least any of the emitter regions 12, the base region 14, the contact region 15 and the accumulation region 16 is provided, each trench portion also extends through these regions to reach the drift region 18. A trench portion extending through doped regions is not limited to the one manufactured in the order that a trench portion is formed after doped regions were formed. A trench portion extending through doped regions includes the one manufactured in the order that doped regions are formed between trench portions after the trench portions were formed.

The gate trench portion 40 includes a gate trench formed at the front surface 21, a gate insulating film 42 and a gate conductive portion 44. The gate insulating film 42 is formed to cover an inner wall of the gate trench. The gate insulating film 42 may be formed by oxidizing or nitriding a semiconductor of the inner wall of the gate trench. The gate conductive portion 44 is formed inside the gate insulating film 42 in the gate trench. The gate insulating film 42 insulates the gate conductive portion 44 from the semiconductor substrate 10. The gate conductive portion 44 is formed of a conductive material such as polysilicon. The gate trench portion 40 is covered with the interlayer dielectric film 38 at the front surface 21.

The gate conductive portion 44 includes a region opposing to the base region 14 in the depth direction of the semiconductor substrate 10, where the gate conductive portion 44 is adjacent to the base region 14 at the side of the mesa portion 71 with the gate insulating film 42 interposed therebetween. If a predetermined voltage is applied to the gate conductive portion 44, an electron inversion layer forms a channel in a surface layer of the base region 14 at a boundary surface in contact with the gate trench.

The dummy trench portion 30 may have the same configuration as the gate trench portion 40. The dummy trench portion 30 includes a dummy trench formed at the side of the front surface 21, a dummy insulating film 32 and a dummy conductive portion 34. The dummy insulating film 32 is formed to cover an inner wall of the dummy trench. The dummy conductive portion 34 is formed in the dummy trench and inside the dummy insulating film 32. The dummy insulating film 32 insulates the dummy conductive portion 34 from the semiconductor substrate 10. The dummy trench portion 30 is covered with the interlayer dielectric film 38 at the front surface 21.

The interlayer dielectric film 38 is provided on the front surface 21. An emitter electrode 52 is provided above the interlayer dielectric film 38. The interlayer dielectric film 38 is provided with one or more contact holes 54 to electrically connect the emitter electrode 52 with the semiconductor substrate 10. Similarly, the contact hole 55 and the contact hole 56 may be provided to extend through the interlayer dielectric film 38.

Figure 3B:
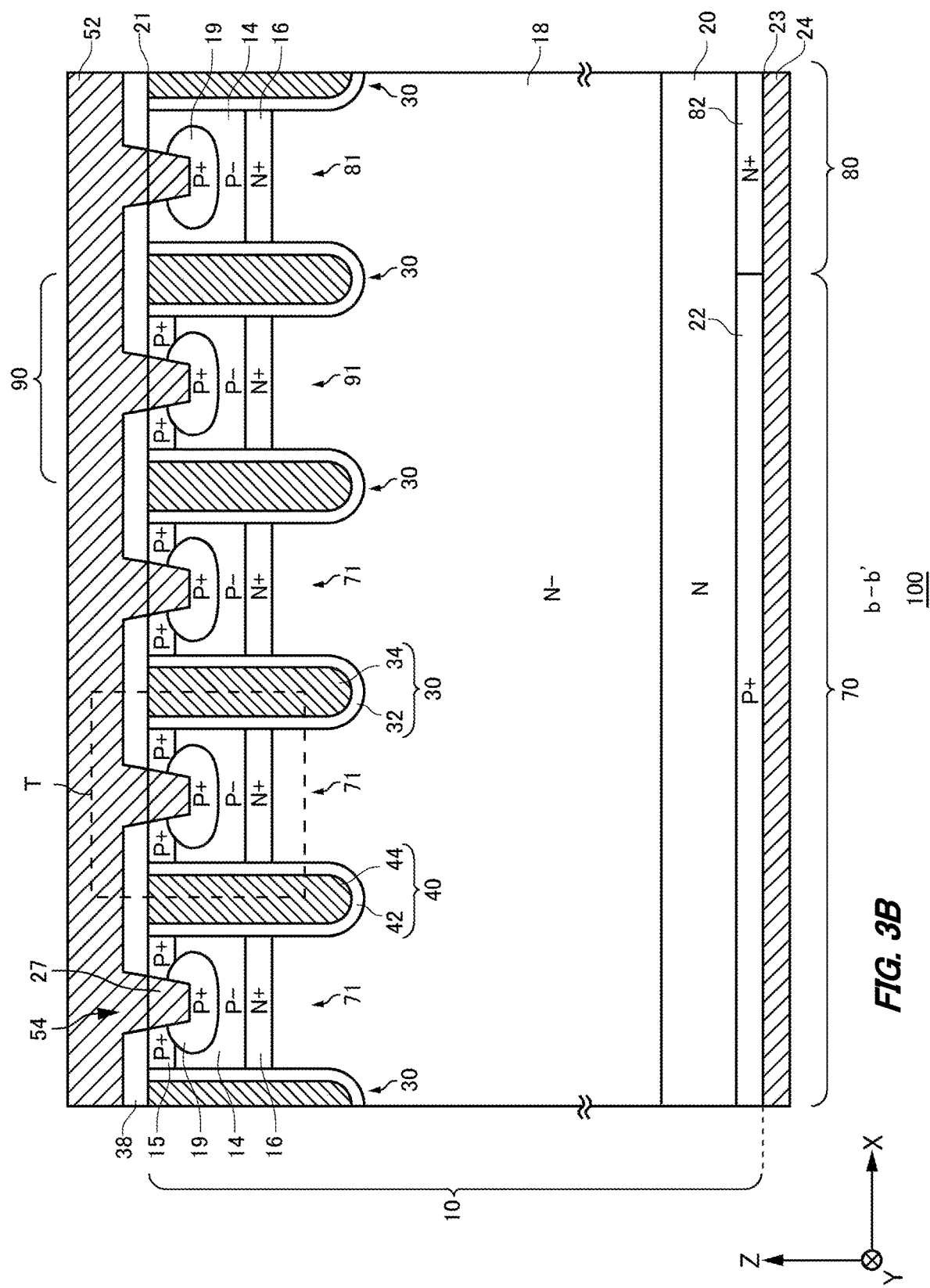
FIG. 3B is a diagram which illustrates an example of a cross section b-b' in FIG. 2.

FIG. 3B is a diagram which illustrates an example of a cross section b-b' in FIG. 2. The cross section b-b' is the XZ plane which extends through the contact region 15 in the transistor portion 70.

The mesa portion 71 includes the base region 14, the contact region 15, the accumulation region 16, and the contact layer 19 in the cross section b-b'. The mesa portion 91 includes, similarly to the cross section a-a', the contact region 15, the accumulation region 16, and the contact layer 19. In the cross section b-b', the mesa portion 71 has the same configuration as the mesa portion 91. The mesa portion 81 includes, similarly to the cross section a-a', the base region 14, the accumulation region 16, and the contact layer 19.

Figure 4A:
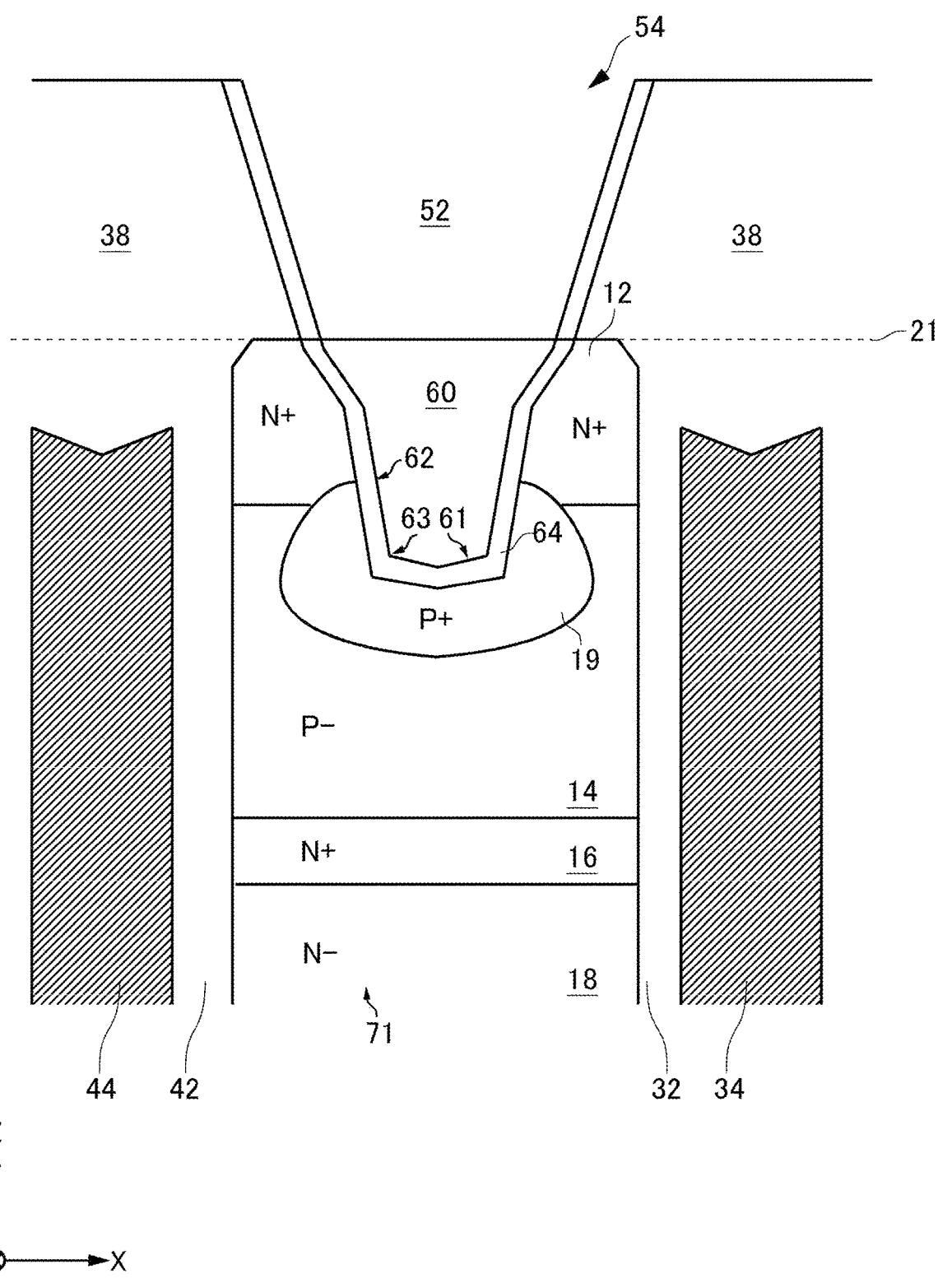
FIG. 4A is an enlarged view which illustrates an example of a region S in FIG. 3A.

FIG. 4A is an enlarged view which illustrates an example of a region S in FIG. 3A. Herein, the contact trench portion 60 and a first barrier layer 64 provided in the mesa portion 71 between the dummy trench portion 30 and the gate trench portion 40 will be mainly discussed.

The contact trench portion 60 includes a bottom surface 61 and a side wall 62. The concave bottom surface 61 of the contact trench portion 60 of the present example is concavely recessed toward the center of the contact trench portion 60 from a side wall bottom 63 which is an end portion of the side wall 62 in the positive direction of the Z axis. The bottom surface 61 of the contact trench portion 60 may be recessed in an arc shape. The concave bottom surface 61 of the contact trench portion 60 is formed by etching for forming the contact hole 54. The bottom surface 61 may also have a linear shape, aside from the concave shape.

The contact layer 19 is provided at the side wall 62 in part and at the bottom surface 61 of the contact trench portion 60. The contact layer 19 is provided to extend closer to the front surface 21 than the lower end of the emitter region 12 in the Z axis direction to come in contact with the emitter region 12. However, the configuration is not necessarily required. The contact layer 19 may be provided to be spaced apart from the emitter region 12.

The first barrier layer 64 is provided at the side wall 62 and the bottom surface 61 of the contact trench portion 60. As an example, the contact trench portion 60 is a tungsten (W) film formed by way of the CVD method using a WF6 gas or the like. In this process, a fluorine component of the WF6 gas may react with silicon in a semiconductor substrate to damage the semiconductor substrate. The first barrier layer 64 is provided between the contact trench portion 60 and the semiconductor substrate 10 to improve the resistance against silicon deficiencies due to the WF6 gas.

The first barrier layer 64 is in contact with the emitter region 12 at the side wall 62 of the contact trench portion 60. In addition, the first barrier layer 64 is conductive. The first barrier layer 64 of the present example contains at least any of Ti, TiN, Ta or TaN. This enables the first barrier layer 64 to form a path at the side wall 62 of the contact trench portion 60 through which a current being discharged from the contact trench portion 60 to the emitter region 12.

In addition, the first barrier layer 64 is in contact with the contact layer 19 at the bottom surface 61 of the contact trench portion 60. This enables the first barrier layer 64 to form a path through which a current is discharged from the contact layer 19 to the contact trench portion 60.

Figure 4B:
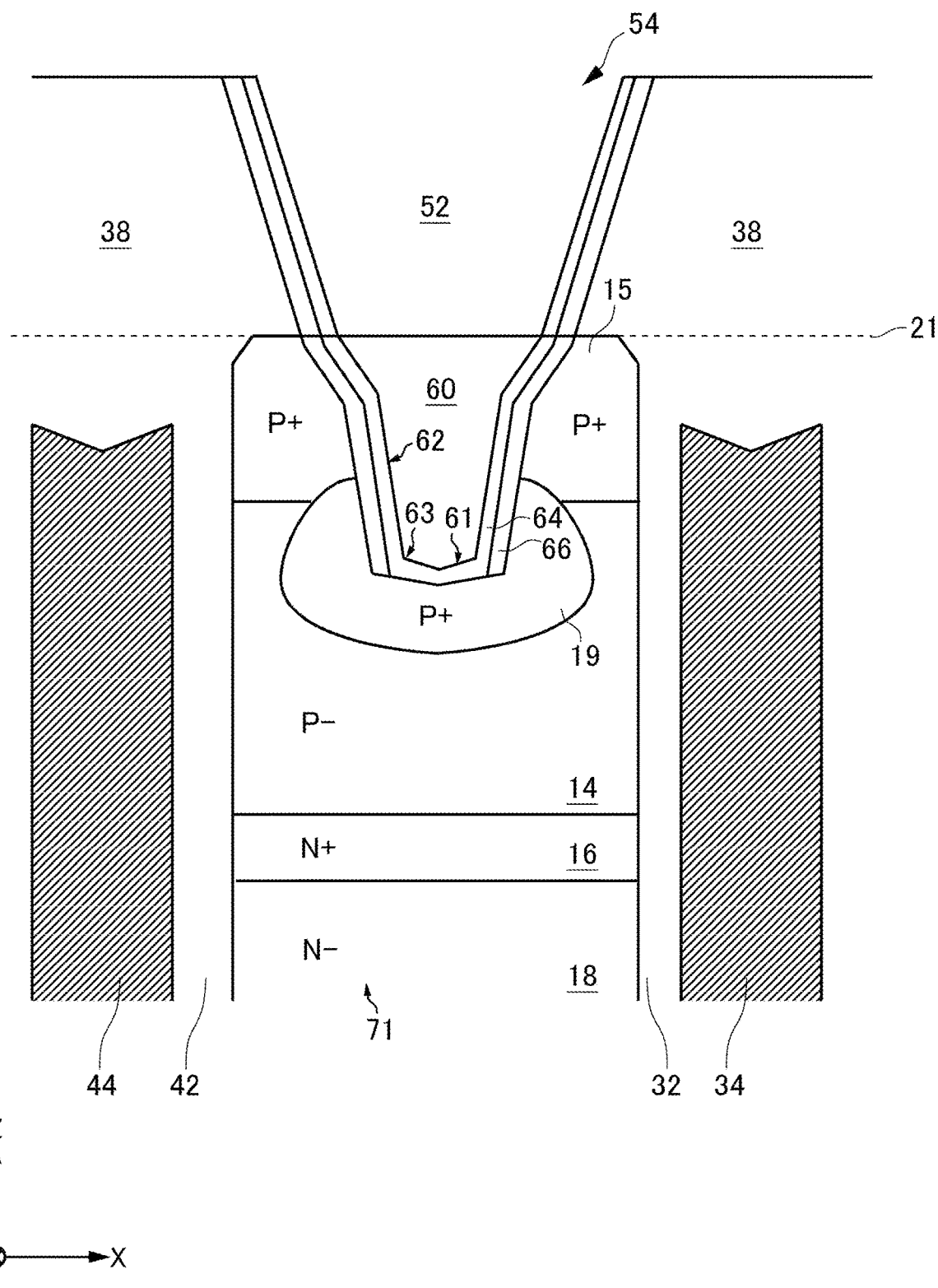
FIG. 4B is an enlarged view which illustrates an example of a region T in FIG. 3B.

FIG. 4B is an enlarged view which illustrates an example of a region T in FIG. 3B. Herein, the contact trench portion 60, the first barrier layer 64 and the second barrier layer 66 provided in the mesa portion 71 between the dummy trench portion 30 and the gate trench portion 40 will be mainly discussed. The mesa portion 81 or the mesa portion 91 may have a similar configuration. In addition, the mesa portion 71, the mesa portion 81 and the mesa portion 91 may have the same configuration in the entire regions, or may have the same configuration only in a part of the regions.

The contact layer 19 is provided at a part of the side wall 62 and the bottom surface 61 of the contact trench portion 60. The contact layer 19 may also be provided to be spaced apart from the contact region 15 at the side wall of the contact trench portion 60.

The first barrier layer 64 is provided the entire regions of the side wall 62 and the bottom surface 61 of the contact trench portion 60. On the other hand, the second barrier layer 66 is provided at the side wall 62 of the contact trench portion 60. In addition, the second barrier layer 66 is provided closer to the contact region 15 than the first barrier layer 64, at the side wall 62 of the contact trench portion 60 adjacent to the contact region 15.

The second barrier layer 66 of the present example is provided in contact with the contact region 15 at the side wall 62 of the contact trench portion 60. In addition, the second barrier layer 66 of the present example is not provided at the bottom surface 61 of the contact trench portion 60, and the first barrier layer 64 is in contact with the contact layer 19 at the bottom surface 61 of the contact trench portion 60.

The second barrier layer 66 of the present example may be an oxide film, and may be a silicon oxide (SiOx) film, as an example. The second barrier layer 66 may be a silicon oxide film containing boron, phosphorous or the like, or may be a conductive silicon oxide film with oxygen deficiency or the like. In addition, the conductivity of the second barrier layer 66 is equal to the conductivity of the first barrier layer 64, or lower than the conductivity of the first barrier layer 64.

As an example, the first barrier layer 64 is deposited by way of sputtering. Sputtering uses a gas of a lower pressure than the CVD method, which makes it difficult to control the film thickness at the side wall 62 of the contact trench portion 60. Therefore, the resistance against silicon deficiencies may be lowered at a portion with a smaller film thickness.

The semiconductor device 100 of the present example includes doubled barrier layers of the first barrier layer 64 and the second barrier layer 66 at the side wall 62 of the contact trench portion 60 adjacent to the contact region 15 to improve the resistance against silicon deficiencies. Note that the second barrier layer 66 may be arranged at a portion in contact with the interlayer dielectric film 38 or may not.

Also note that the second barrier layer 66 of the present example is provided in a region adjacent to the contact region 15 at the side wall 62 of the contact trench portion 60, but not provided in a region adjacent to the emitter region 12. However, in the front surface 21 of the semiconductor substrate 10, the area of the contact region 15 is much greater than the area of the emitter region 12. Therefore, the area of the side wall 62 of the contact trench portion 60 adjacent to the contact region 15 is much greater than the area adjacent to the emitter region 12.

Thus, the semiconductor device 100 of the present example is selectively provided with the second barrier layer 66 in a region adjacent to the contact region 15 at the side wall 62 of the contact trench portion 60 to maintain a path for a current through the first barrier layer 64. In this manner, the semiconductor device 100 of the present example can improve the resistance against silicon deficiencies, while serving as a device.

Figure 5:
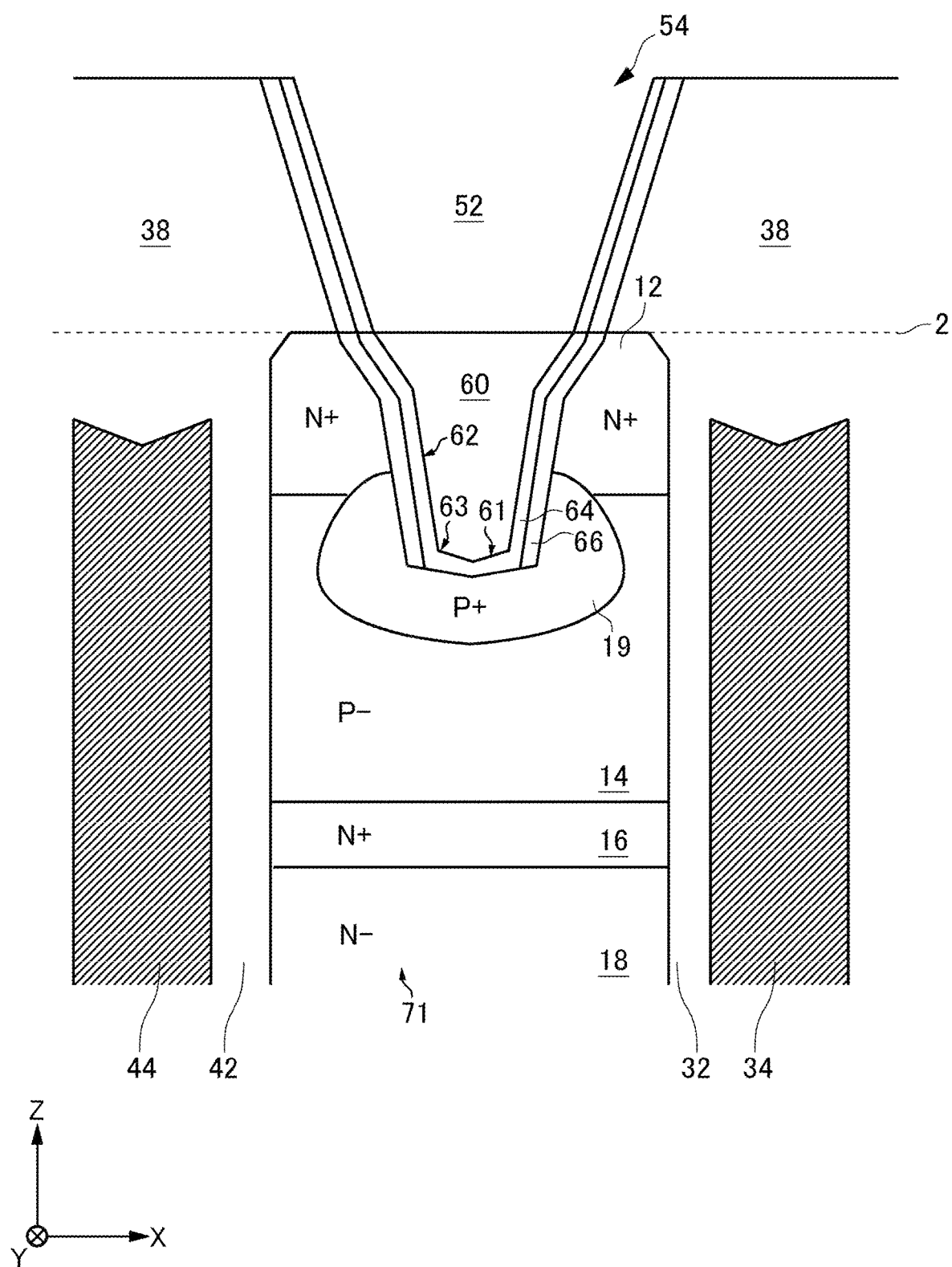
FIG. 5 is an enlarged view which illustrates another example of the region S in FIG. 3A.

FIG. 5 is an enlarged view which illustrates another example of the region S in FIG. 3A. Herein, differences from FIG. 4A will be mainly discussed.

The second barrier layer 66 of the present example is provided in contact with the emitter region 12 at the side wall 62 of the contact trench portion 60 adjacent to the emitter region 12. On the other hand, at the side wall 62 of the contact trench portion 60 adjacent to the contact region 15, the second barrier layer 66 is provided in contact with the contact region 15, similarly to FIG. 3B.

That is, the first barrier layer 64 of the present example is provided at the entire regions of the side wall 62 and the bottom surface 61 of the contact trench portion 60. The second barrier layer 66 is not provided at the bottom surface 61 of the contact trench portion 60, but provided in the entire side wall 62 of the contact trench portion 60. The second barrier layer 66 is provided closer to the emitter region 12 and the contact region 15 than the first barrier layer 64 at the side wall 62 of the contact trench portion 60.

The second barrier layer 66 is an oxide film containing impurities, as an example. The second barrier layer 66 of the present example may be a silicon oxide film containing boron, phosphorous or the like. The second barrier layer 66 is at least conductive, although it is less conductive than the first barrier layer 64. The second barrier layer 66 may also have the same conductivity as that of the first barrier layer 64.

A contact resistance between the second barrier layer 66 and the contact region 15 of the present example may be approximately 100Ω or less, or preferably approximately 10Ω or less, in the present example Note that the contact resistance depends on the design specification of the device, but is not necessarily limited to the range as set forth above.

Preferably, the second barrier layer 66 has a film thickness such that it has the resistance against silicon deficiencies due to the WF6 gas. The film thickness may be 1 nm or more, or preferably approximately 5 nm or more. In addition, the upper limit of the film thickness of the second barrier layer 66 depends on the resistivity of the second barrier layer 66. Preferably, the film thickness fall within the range of the contact resistance as set forth above. For example, the upper limit of the film thickness of the second barrier layer 66 may be 50 nm.

In this manner, the second barrier layer 66 of the present example is provided at the entire side wall 62 of the contact trench portion 60, which makes the fabrication process easy. In addition, as set forth above, the area of the side wall 62 of the contact trench portion 60 adjacent to the contact region 15 is much greater than the area adjacent to the emitter region 12. In addition, the second barrier layer 66 of the present example is at least conductive. In this manner, the semiconductor device 100 of the present example includes the second barrier layer 66 in contact with both of the emitter region 12 and the contact region 15 at the side wall 62 of the contact trench portion 60, thereby improving the resistance against silicon deficiencies while serving as a device.

Figure 6:
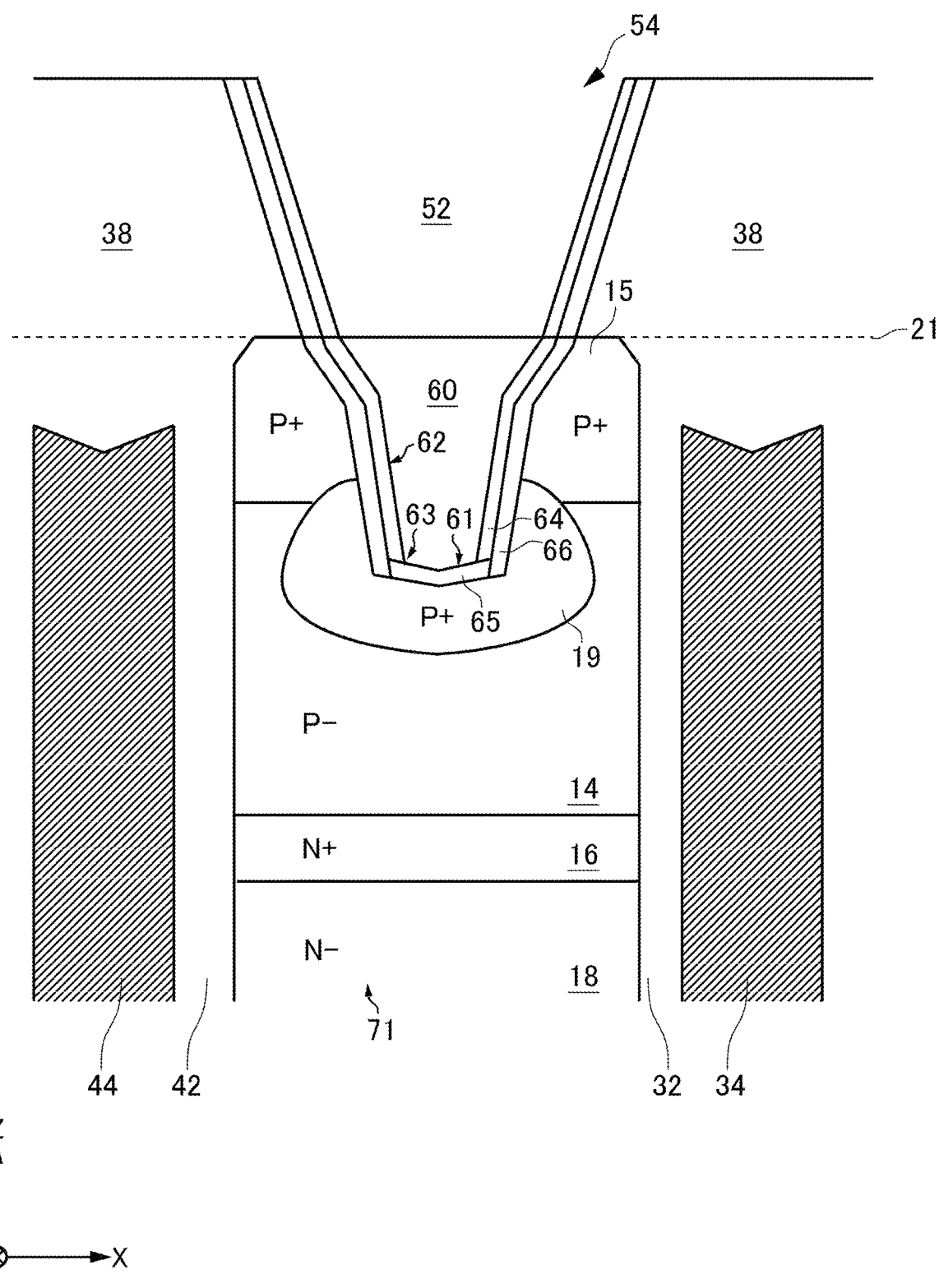
FIG. 6 is an enlarged view which illustrates another example of the region T in FIG. 3B.

FIG. 6 is an enlarged view which illustrates another example of the region T in FIG. 3B. Herein, differences from FIG. 4B will be mainly discussed.

The first barrier layer 64 includes a silicide region 65 which has been silicided at the bottom surface 61 of the contact trench portion 60. As an example, the silicide region 65 includes Ti silicide or Ta silicide. On the other hand, the side wall 62 of the contact trench portion 60 is provided with the second barrier layer 66 closer to the contact region 15 than the first barrier layer 64 such that the first barrier layer 64 does not include a silicide region.

Note that the side wall 62 of the contact trench portion 60 adjacent to the emitter region 12 may be provided with the second barrier layer 66 in contact with the emitter region 12, as in FIG. 5, or may not be provided with the second barrier layer 66, as in FIG. 4A. If the side wall 62 of the contact trench portion 60 is provided with the first barrier layer 64 in contact with the emitter region 12, as in FIG. 4A, the first barrier layer 64 also includes the silicide region 65 at the side wall 62 of the contact trench portion 60, thereby improving properties of the device.

Figure 7:
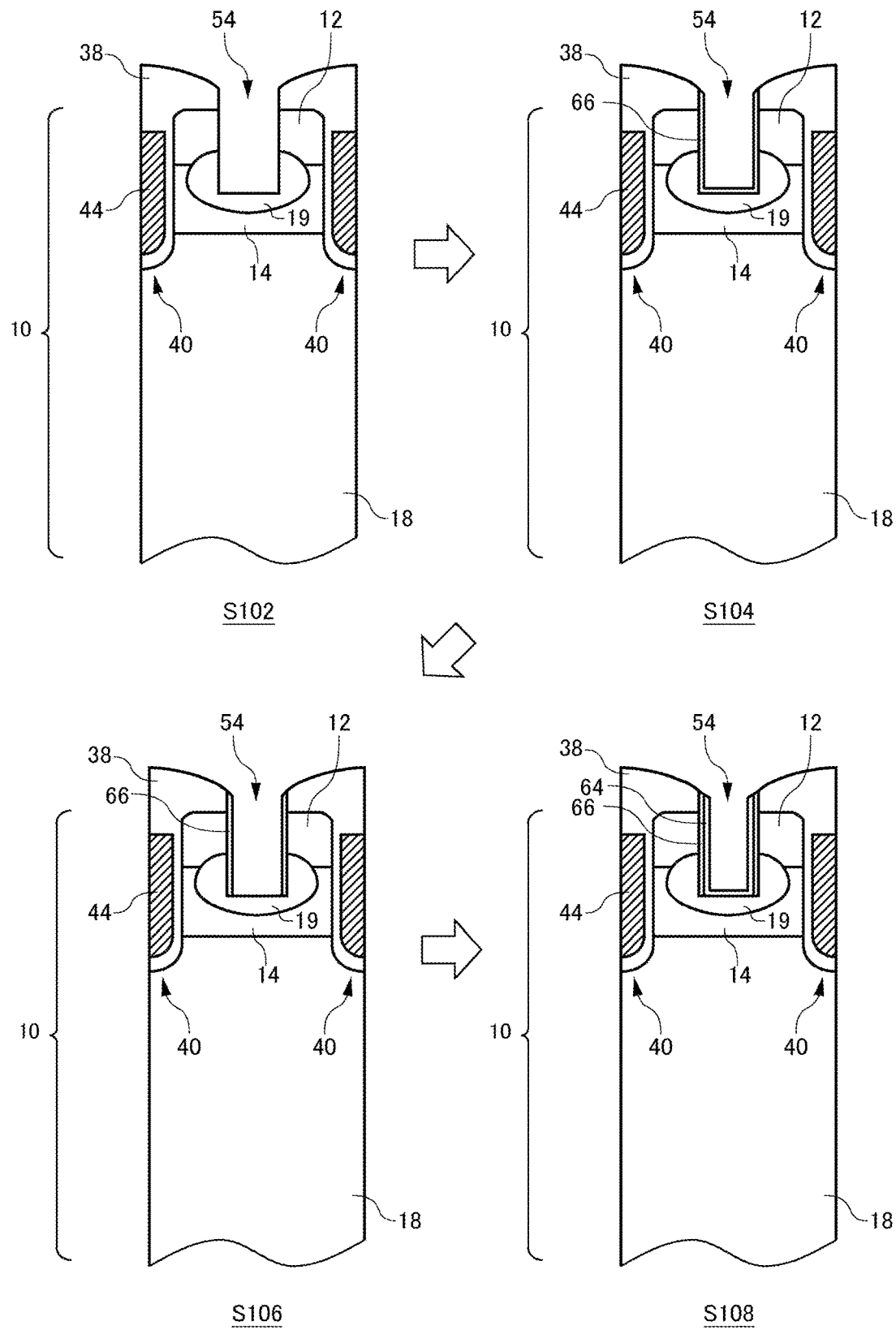
FIG. 7 is a diagram which illustrates an example of a manufacturing method of the first barrier layer 64 and the second barrier layer 66.

FIG. 7 is a diagram which illustrates an example of a manufacturing method of the first barrier layer 64 and the second barrier layer 66.

In the step S 102, the semiconductor substrate 10 undergoes etching through the emitter region 12 to the base region 14 to form the contact hole 54. In this step, the semiconductor substrate 10 undergoes anisotropic etching to form the contact hole 54, by use of the interlayer dielectric film 38 which includes an etched region corresponding to the contact hole 54 as an oxide film mask.

In addition, in the step S 102, the semiconductor substrate 10 undergoes ion implantation to form the contact layer 19 by use of the interlayer dielectric film 38 as a mask, and heat treatment to form the contact layer 19. The contact layer 19 may be provided to extend to the emitter region 12 by the heat treatment.

Note that, in the present example, the ion implantation is performed to form the contact layer 19 after the contact hole 54 for the contact trench portion 60 is provided. That is, the ion implantation of the dopant for the contact layer 19 is performed by use of the interlayer dielectric film 38 as a mask, thereby improving accuracy of positioning of the contact layer 19 with respect to the contact trench portion 60.

In the step S104, the entire inner surface of the contact hole 54 undergoes deposition with an oxide including boron, phosphorous or the like to form the second barrier layer 66.

In the step S106, the bottom surface of the contact hole 54 undergoes anisotropic etching or the like to remove the second barrier layer 66.

In the step S108, the entire inner surface of the contact hole 54 undergoes deposition with Ti or the like to form the first barrier layer 64.

Note that, in the region which only includes the first barrier layer 64 formed therein, as in FIG. 4A, the second barrier layer 66 may be removed from the inner wall of the contact hole 54 by way of patterning or the like in the step S106.

Figure 8:
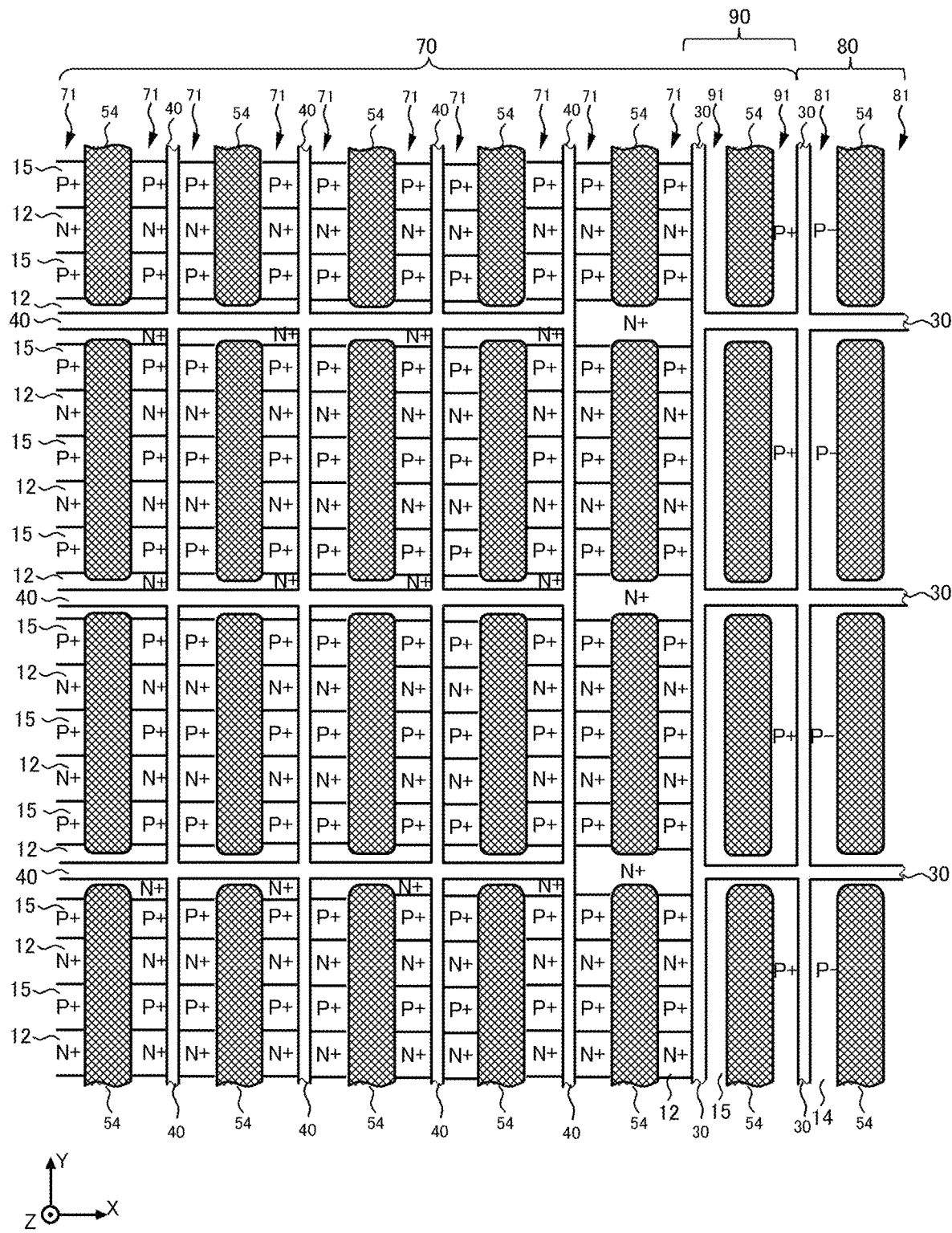
FIG. 8 is an enlarged view which illustrates an example of a region B in FIG. 1.

FIG. 8 is an enlarged view which illustrates an example of a region B in FIG. 1. Note that FIG. 1 to FIG. 7 illustrate the configurations in which the dummy trench portions 30 and the gate trench portions 40 are arranged in the predetermined arrangement direction at the side of the front surface 21 of the semiconductor substrate 10. On the other hand, FIG. 8 illustrates the configuration in which the dummy trench portions 30 and the gate trench portions 40 are arranged in a grid at the side of the front surface 21 of the semiconductor substrate 10.

As an example, in the transistor portion 70, a plurality of gate trench portions 40 which extend in the Y axis direction and are arranged in the X axis direction and a plurality of gate trench portions 40 which extend in the X axis direction and are arranged in the Y axis direction are arranged in a grid. In addition, in the diode portion 80 and the boundary portion 90, a plurality of dummy trench portions 30 which extend in the Y axis direction and are arranged in the X axis direction and a plurality of dummy trench portions 30 which extend in the X axis direction and are arranged in the Y axis direction are arranged in a grid.

FIG. 8 illustrates the transistor portion 70 in a full gate configuration including no dummy trench portions 30, but is not limited thereto. The transistor portion 70 may also include the dummy trench portion 30 and the gate trench portion 40. Note that the interlayer dielectric film 38 and the emitter electrode 52 are omitted from FIG. 8.

The mesa portion 71, the mesa portion 81 and the mesa portion 91 are provided with the contact holes 54. The contact trench portion 60 is provided in the contact hole 54. The contact trench portion 60 is provided to extend in the extending direction. The contact trench portion 60 is arranged in a matrix form between the trench portions arranged in a grid.

Figure 9A:
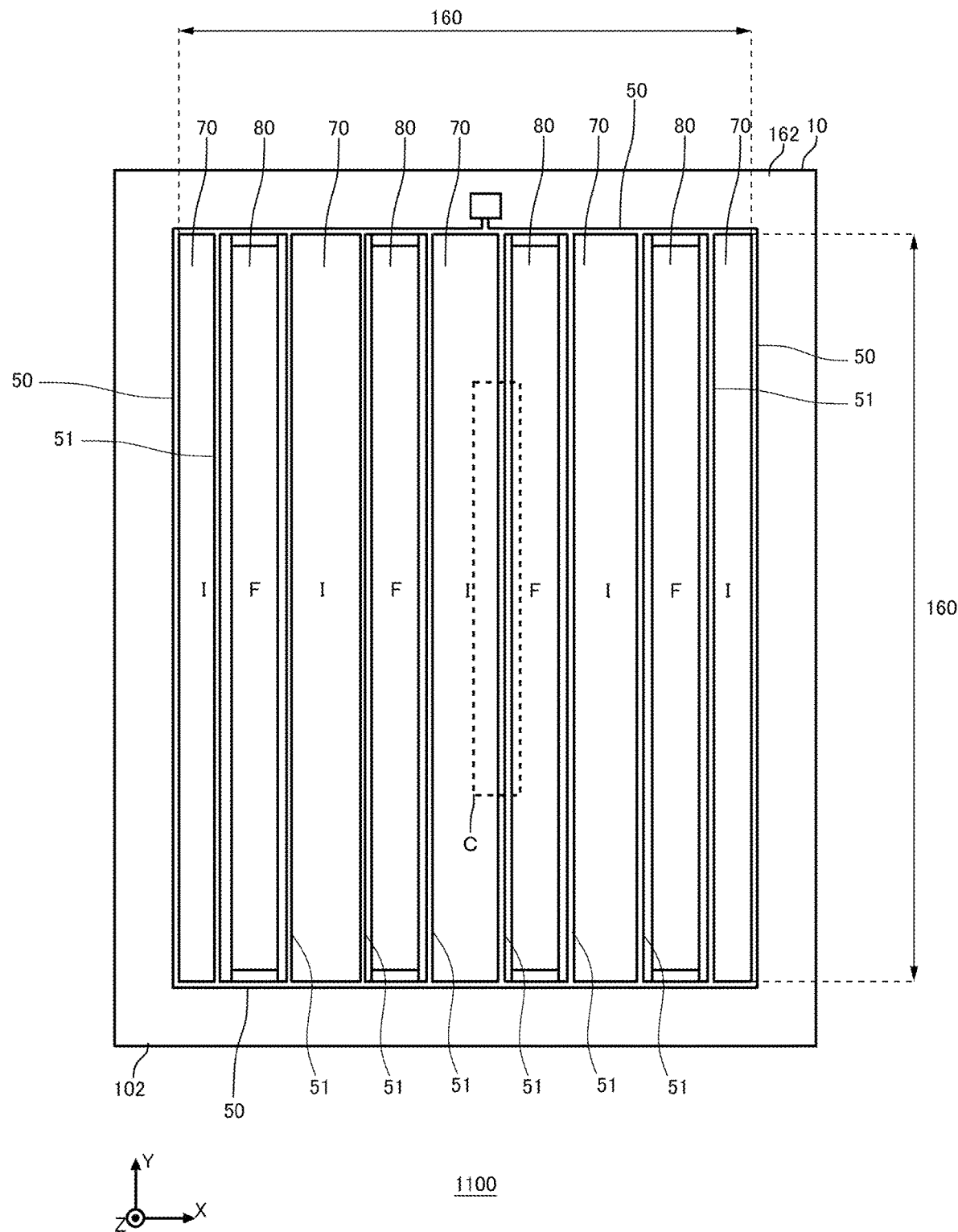
FIG. 9A illustrates an example of a top view of a semiconductor device 1100 according to the example.

FIG. 9A illustrates an example of a top view of a semiconductor device 1100 according to the example. Herein, the same components as in the semiconductor device 100 are provided with the same signs, and differences will be mainly discussed.

The semiconductor device 1100 includes an inner gate metal layer 51, in addition to the gate metal layer 50. The inner gate metal layer 51 extends in the Y axis direction in the active region 160 and is connected to the gate metal layer 50. FIG. 9A only illustrates a couple of inner gate metal layers 51 for the sake of simplification, but they are not limited thereto. As will be described below, the inner gate metal layers 51 are provided to extend above a plurality of gate trench portions 40.

Figure 9B:
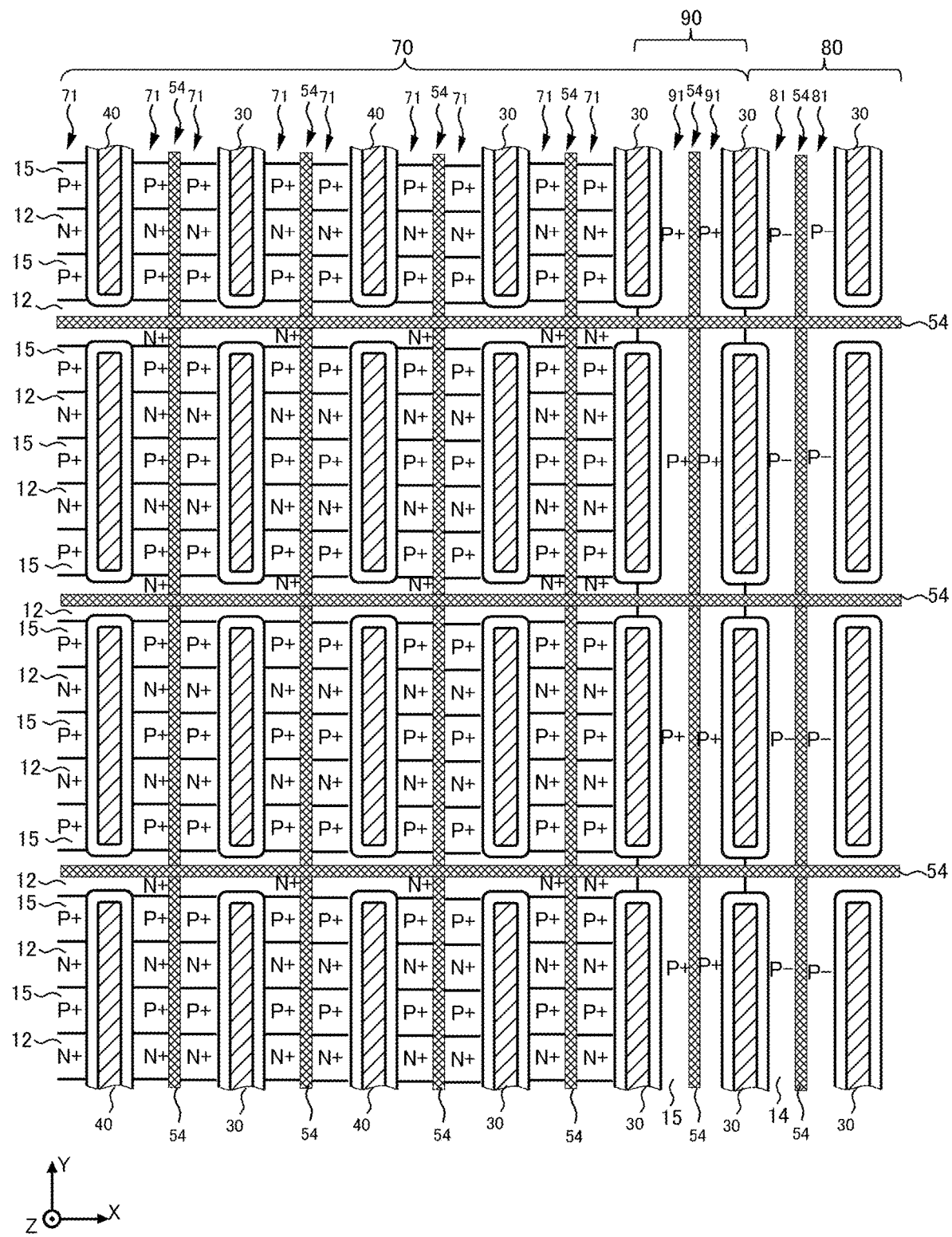
FIG. 9B is an enlarged view which illustrates an example of a region C in FIG. 9A.

FIG. 9B is an enlarged view which illustrates an example of a region C in FIG. 9A. The semiconductor device 1100 includes the trench portions arranged in a matrix form at the side of the front surface 21 of the semiconductor substrate 10. That is, while the semiconductor device 100 includes the respective trench portions extending in the Y axis direction, the semiconductor device 1100 includes the respective trench portions divided into a plurality of portions in the Y axis direction to be arranged in a matrix form as a whole.

In FIG. 9B, the gate trench portion 40 and the dummy trench portion 30 are adjacent to the contact region 15 at the end portions in the Y axis direction in the transistor portion 70, but are not limited thereto. The gate trench portion 40 and the dummy trench portion 30 may be adjacent to the emitter region 12 at the end portions in the Y axis direction.

Above the respective gate trench portions 40, the inner gate metal layer 51 is provided to extend in the Y axis direction along each gate trench portion 40, but is omitted from FIG. 9B. In this manner, the gate trench portion 40 is connected to the gate pad via the inner gate metal layer 51 and the gate metal layer 50.

The mesa portion 71, the mesa portion 81 and the mesa portion 91 are provided with the contact holes 54. The contact trench portion 60 is provided in the contact hole 54. The contact trench portion 60 is provided to extend in the extending direction. The contact trench portion 60 is arranged in a grid between the trench portions arranged in a matrix form.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: contact region, 16: accumulation region, 17: well region, 18: drift region, 19: contact layer, 21: front surface, 22: collector region, 23: back surface, 24: collector electrode, 25: connecting part, 30: dummy trench portion, 31: extending portion, 32: dummy insulating film, 33: connecting portion, 34: dummy conductive portion, 38: interlayer dielectric film, 40: gate trench portion, 41: extending portion, 42: gate insulating film, 43: connecting portion, 44: gate conductive portion, 50: gate metal layer, 51: inner gate metal layer, 52: emitter electrode, 54: contact hole, 55: contact hole, 56: contact hole, 60: contact trench portion, 61: bottom surface, 62: side wall, 63: side wall bottom, 64: first barrier layer, 65: silicide region, 66: second barrier layer, 68: terminal end, 70: transistor portion, 71: mesa portion, 80: diode portion, 81: mesa portion, 82: cathode region, 90: boundary portion, 91: mesa portion, 100: semiconductor device, 102: end side, 160: active region, 162: edge termination structure, 1100: semiconductor device

What is claimed is:

1. A semiconductor device comprising:
a drift region of first conductivity type provided in a semiconductor substrate;
a base region of second conductivity type provided in the semiconductor substrate;
an emitter region of first conductivity type provided at a front surface of the semiconductor substrate;
a contact region of second conductivity type provided on the base region and having a higher doping concentration than the base region;
a contact trench portion provided at the front surface of the semiconductor substrate;
a first barrier layer provided at a side wall and a bottom surface of the contact trench portion; and
a second barrier layer provided in contact with the contact region at the side wall of the contact trench portion, wherein
the second barrier layer is a silicon oxide film, and
a contact resistance between the second barrier layer and the emitter region is 100Ω or less.

2. The semiconductor device according to claim 1, wherein the second barrier layer is provided in contact with the emitter region at the side wall of the contact trench portion.

3. The semiconductor device according to claim 1, wherein the second barrier layer has a film thickness of 1 nm or more and 50 nm or less.

4. The semiconductor device according to claim 2, wherein the second barrier layer has a film thickness of 1 nm or more and 50 nm or less.

5. The semiconductor device according to claim 1, wherein a conductivity of the second barrier layer is the same as or lower than a conductivity of the first barrier layer.

6. The semiconductor device according to claim 2, wherein a conductivity of the second barrier layer is the same as or lower than a conductivity of the first barrier layer.

7. The semiconductor device according to claim 1, wherein the first barrier layer contains at least any of Ti, TiN, Ta or TaN.

8. The semiconductor device according to claim 1, wherein the first barrier layer includes a silicide region which has been solicited at the bottom surface of the contact trench portion.

9. The semiconductor device according to claim 1, wherein the contact trench portion is arranged in a stripe pattern between and along a plurality of trench portions, the plurality of trench portions being arranged in a predetermined arrangement direction at the side of the front surface of the semiconductor substrate.

10. The semiconductor device according to claim 1, wherein the contact trench portion is arranged in a matrix form between a plurality of trench portions arranged in a grid at the side of the front surface of the semiconductor substrate.

11. The semiconductor device according to claim 1, wherein the contact trench portion is arranged in a grid between and along a plurality of trench portions, the plurality of trench portions being arranged in a matrix form at the side of the front surface of the semiconductor substrate.

12. A semiconductor device, comprising:
a drift region of first conductivity type provided in a semiconductor substrate;
a base region of second conductivity type provided in the semiconductor substrate;
an emitter region of first conductivity type provided at a front surface of the semiconductor substrate;
a contact region of second conductivity type provided on the base region and having a higher doping concentration than the base region;
a contact trench portion provided at the front surface of the semiconductor substrate;
a first barrier layer provided at a side wall and a bottom surface of the contact trench portion; and
a second barrier layer provided in direct contact with the contact region at the side wall of the contact trench portion,
wherein the first barrier layer is provided in direct contact with the emitter region at the side wall of the contact trench portion.

13. The semiconductor according to claim 12, wherein the second barrier layer has a film thickness of 1 nm or more and 50 nm or less.

14. The semiconductor device according to claim 12, wherein a conductivity of the second barrier layer is the same as or lower than a conductivity of the first barrier layer.

* * * * *